United States Patent
Krieger

(10) Patent No.: US 6,417,946 B1
(45) Date of Patent: Jul. 9, 2002

(54) DATA TRANSMITTER/RECEIVER

(75) Inventor: Jochen Krieger, Obrigheim (DE)

(73) Assignee: Vishay Semiconductor GmbH, Heilbronn (DE)

( * ) Notice: Subject to any disclaimer, the term of this patent is extended or adjusted under 35 U.S.C. 154(b) by 0 days.

(21) Appl. No.: 09/256,962

(22) Filed: Feb. 24, 1999

(30) Foreign Application Priority Data

Feb. 26, 1998 (DE) .......................................... 198 08 004

(51) Int. Cl.[7] .......................... H04B 10/00; H09L 27/15; H09L 31/12; H09L 33/00; H09L 23/06; H09L 23/02; H09L 23/48
(52) U.S. Cl. .......................... 359/152; 257/81; 257/82; 257/684; 257/685; 257/696; 257/100
(58) Field of Search .................. 359/152, 163; 257/684, 685, 81, 82, 696, 100, 79, 80, 84, 99

(56) References Cited

U.S. PATENT DOCUMENTS

| 5,122,893 A | * | 6/1992 | Tolbert .......................... 359/152 |
| 6,157,476 A | * | 12/2000 | Angerstein et al. .......... 359/152 |
| 6,160,647 A | * | 12/2000 | Gilliland et al. ............. 359/110 |

* cited by examiner

Primary Examiner—Jason Chan
Assistant Examiner—David C. Payne
(74) Attorney, Agent, or Firm—W. F. Fasse; W. G. Fasse

(57) ABSTRACT

A transceiver, especially an infrared transceiver, has a flat surface section and at least one or two lens forming housing sections integrally formed with the flat housing section. The lens housing sections are positioned so that one flat surface of the flat housing extends tangentially to the lens housing section or sections while the latter project outside the opposite flat housing surface. The lens housing section or sections are positioned along an edge of the flat housing section. For this purpose the lens forming housing section or sections have a substantially larger diameter (D) than the thickness (d) of the flat housing section. The respective lenses thus may have a substantially larger aperture, thereby increasing the wireless transmission and reception range of optical data transmission signals, in accordance with IRDA standards.

12 Claims, 2 Drawing Sheets

DATA TRANSMITTER/RECEIVER

CROSS-REFERENCE TO RELATED APPLICATION

This application is related to our copending applications U.S. Ser. No. 09/104,766 and U.S. Ser. No. 09/104,767, both filed on Jun. 25, 1998, and both entitled "COMPONENT FOR OPTICAL DATA TRANSMISSION". The entire disclosures of said U.S. Applications are incorporated herein by reference.

PRIORITY CLAIM

This application is based on and claims the priority under 35 U.S.C. §119 of German Patent Application 198 08 004.2, filed on Feb. 26, 1998, the entire disclosure of which is incorporated herein by reference.

FIELD OF THE INVENTION

The invention relates to a structural component forming a transmitter and a receiver for a bi-directional, wireless transmission of data carried by radiation energy particularly in the range of infrared radiation to and including ultraviolet radiation.

BACKGROUND INFORMATION

Such transceivers are currently used for data transmissions particularly with an infrared radiation carrier for which IRDA standards have been developed. The data transmission takes place optically from one point to another in accordance with the just mentioned standards, for example for remote controlled purposes. The firm Temic Semiconductor GmbH of Heilbronn, Germany markets such transceivers as Models TFDS 4000 or TFDS 6000 for various purposes. These transceivers have integrated components and features satisfying the IRDA (Infrared Data Association) standard.

One such transceiver is described in European Patent Publication EP 0,712,161 A1. An infrared transmitter or emitter is housed in a special housing and an infrared receiver or detector is arranged in the same housing in combination with an integrated circuit for signal processing and amplification. These three semiconductor chips for the emitter, the detector, and the processing circuit are supported on a conductor strip arrangement with at least three strip sections positioned in two planes extending perpendicularly to one another. This type of arrangement results in a structural grouping having very small housing dimensions particularly for use in a PCMCIA card for infrared communication in connection with personal computers.

The above conventional semiconductor structural component for bi-directional optical wireless transmissions however has certain drawbacks. For example, due to the small apertures of the lenses that are arranged in front of the detector chip and in front of the emitter chip, the optical transmitting and receiving power is rather low, whereby the transmission range of the optical data transmission is noticeably limited.

OBJECTS OF THE INVENTION

In view of the foregoing it is the aim of the invention to achieve the following objects singly or in combination:

to substantially increase the optical transmission and reception power for wireless optical transceivers operating with electromagnetic waves in the range of infrared to and including ultraviolet;

to construct the present transceiver, especially its housing, in such a way that a substantially larger lens aperture can be realized without requiring a larger housing for accommodating a larger lens or lenses;

to arrange the components of the transceiver in such a way in a housing that a thin housing can carry a thick lens or thick lenses;

to construct the housing of the transceiver in two but integral sections including a circuit and chip section and a lens section with the latter thicker than the former; and to increase the lens diameter for an enlarged aperture and a correspondingly increased transmission and reception range while simultaneously optimally reducing the dimensions of a housing carrying the lens or lenses.

SUMMARY OF THE INVENTION

A transceiver according to the invention is characterized by the combination of the following features. A transceiver housing is divided into two sections, namely a flat section to house circuit components and a lens section for focussing or bundling radiation. An electrically conducting strip for supporting the circuit components including emitter/detector chips is mounted in the flat housing section and a lens or lenses are formed as integral parts of the second housing section. The electrically conducting strip is preferably a grid strip and has a first mounting plane on which a circuit such as an integrated circuit is mounted, and a second mounting plane carrying an emitter chip and a detector chip. Alternatively, the integrated circuit and the chips are mounted on the same mounting plane of the grid strip. The first housing section is flat and has two opposed surfaces extending in parallel to each other and are larger in area than the side surfaces of the first housing section. The second housing section has a spherical or hemispherical shape to form the lens or lenses having a directional optical axis. The diameter D of the hemisphere or sphere is substantially larger than the thickness d of the first housing section (D>d). Further, the optical lens axis of the hemisphere or sphere and a mounting plane of the transceiver are spaced from one another by a spacing "a" in such a way that the surface of the hemisphere or sphere does not project outside both flat surfaces of the flat housing section but only outside one surface of the flat housing section. Further, the lens section of the housing is positioned alongside an edge of the flat housing section so that the lens section or a portion thereof can project to a level below or outside one of the flat housing section walls, whereby the optical lens axis or axes can be oriented for a "side view" or a "down view".

The advantages of the present transceiver are seen in that the positioning of the hemisphere or sphere permits substantially larger apertures for the lenses which are positioned in front of the emitter chip and in front of the detector chip. Larger lenses permit increasing the optical transmitter power and the optical receiver power which has the advantage that the transmission certainty and the transmission range are substantially increased compared to conventional transceivers. Due to the component arrangement according to the invention, the first housing section can have a flat parallelepiped shape which permits a symmetric arrangement of the terminals that define the above mentioned mounting plane, whereby the insertion of circuit elements and chips by an insertion automat is facilitated. The size of the present transceiver corresponds approximately to the size of an SO-8 housing (small outline with eight terminals). Yet, the transmission range is increased by a factor that is proportional to the square of the lens aperture surface sizes gained by the invention compared to the conventional lens aperture sizes in a housing of the same size as the present housing, Thus, no special housings are necessary for achieving the improved transmission range with the present transceiver.

BRIEF DESCRIPTION OF THE DRAWINGS

In order that the invention may be clearly understood it will now be described in connection with example embodiments, with reference to the accompanying drawings, wherein.

DETAILED DESCRIPTION OF PREFERRED EXAMPLE EMBODIMENTS AND OF THE BEST MODE OF THE INVENTION

Figure 1A:
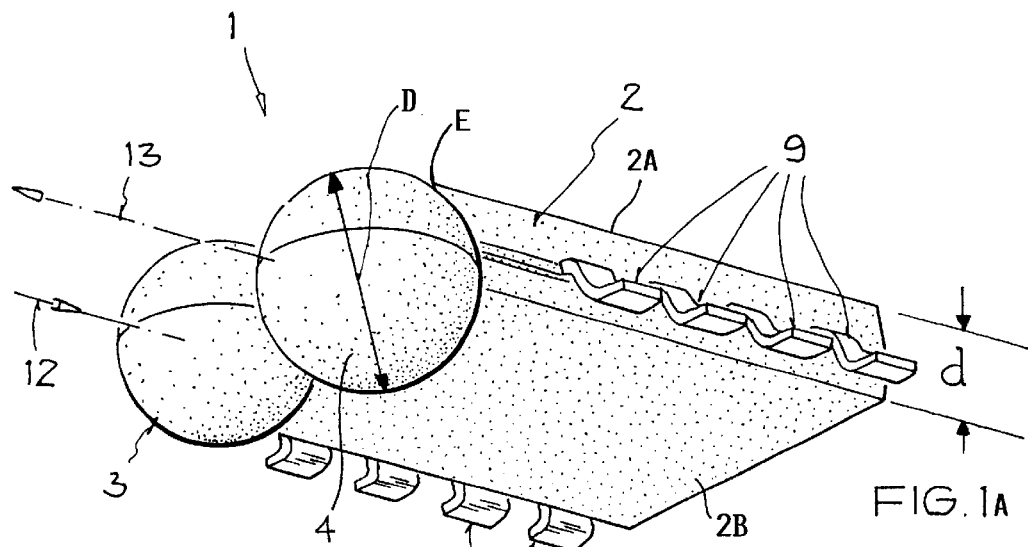
FIG. 1A is a perspective view of a first embodiment of the transceiver according to the invention shown as a so-called side view embodiment with two lens housing sections projecting downwardly along an edge of a flat housing section.
Figure 1B:
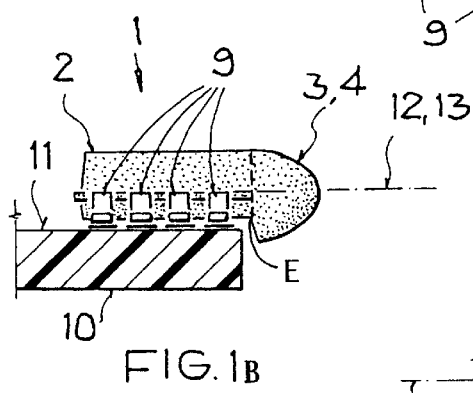
FIG. 1B is a sectional view of a transceiver as shown in FIG. 1A, mounted on a printed circuit board with a lens housing section reaching partly into the space along an edge of the circuit board and below the top surface of the circuit board.
Figure 1C:
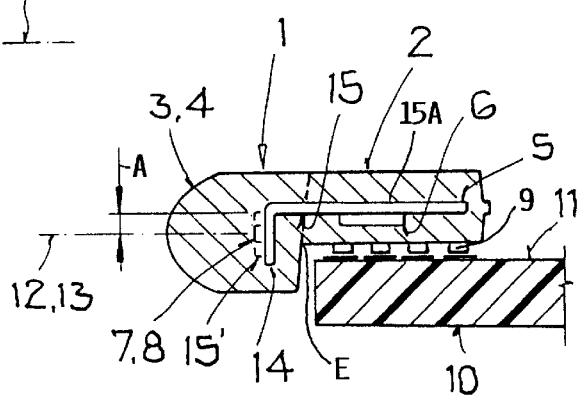
FIG. 1C is a sectional view longitudinally through both housing sections illustrating the position of the lens housing section relative to a circuit board.

FIGS. 1A, 1B and 1C illustrate a transceiver 1 for directed, bi-directional, optical, wireless data transmissions by means of electrical and optical data signals. The transceiver is constructed for a side view mode. The transceiver 1 includes an elongated first flat housing section 2 having a parallelepiped shape and at least one second housing section 3, preferably two second housing sections 3 and 4, having a spherical configuration arranged laterally along one side wall or edge E of the flat housing section 2. The flat first section 2 has a thickness d between its parallel surfaces 2A and 2B. The spherical second sections have a diameter D.

The arrangement shown is referred to as a side view mode because the radiation wave energy enters and leaves the transceiver 1 laterally as symbolized by optical, directional axes 12 and 13. The housing section 2 is made of a known potting mass and comprises an electrically conducting strip 5 preferably forming a grid carrier or support or mounting for an integrated circuit 6, for an emitter chip 7 for emitting optical data signals, and for a detector chip 8 for receiving optical data signals. A downwardly facing surface 15 of the mounting strip 5 forms a first insertion plane for mounting the integrated circuit 6. The insertion of the integrated circuit 6 on the downwardly facing surface of the mounting strip 5 has the advantage that the mounting strip 5 forms a screen for the integrated circuit 6 against electromagnetic interferences. Further, the strip 5 is connected to ground potential. A second insertion plane 15' is formed for the insertion of the emitter chip 7 and of the detector chip 8. The insertion plane surface 15' is part of a bent portion 14 of the mounting strip 5 which is bent over by 90° so that the bent planes 15 and 15' extend at right angles to one another. The surface 15' and a surface 15A are on the same side of the strip 5. The integrated circuit is inserted on one side of the strip 5 while the chips 7, 8 are inserted on the opposite side, more specifically the opposite side of the bent over portion 14 of the strip 5.

The first housing section 2 is equipped with laterally extending connector terminals 9 that form a mounting plane 11 which coincides with the mounting surface of a printed circuit board 10 seen in FIGS. 1B and 1C. The housing section 2 is dimensioned to correspond to a conventional housing for integrated circuits suitable for surface mounting. Such housings are referred to as SO-8 housings (small outline with eight terminals). The housing section 2 is made of a conventional synthetic material for making housings for integrated circuits, whereby the integrated circuit 6 is encapsulated or embedded in the housing section 2.

The second and third housing sections 3 and 4 are optical systems in the form of lenses having an optical axis 12 and an optical axis 13, respectively. These housing sections 3 and 4 are preferably made of a thermoplastic or thermosetting synthetic material transparent or permeable for radiation involved, for example infrared radiation. For example, the housing section 3 forms a lens for focussing the infrared rays emitted by the emitter chip 7, thereby bundling these rays for travelling through a certain transmission range. Further, the third housing section 4 forms a focussing lens that transmits the infrared radiation to the detector chip 8.

The integrated circuit 6 processes the electrical data signals. More specifically, the photocurrent provided by the detector chip a is amplified in response to infrared radiation received by the detector chip 8. Additionally, it is possible to amplify electrical data signals in the integrated circuit 6 prior to emitting these electrical data signals in the form of infrared or other radiation by the emitter chip 7 toward a receiver section of another transceiver. Furthermore, the integrated circuit 6 is equipped, for special applications, to encode data signals to be transmitted through the emitter 7. The integrated circuit 6 can also decode received encoded data signals.

In order to achieve a certain optical output radiation power and a respective received power, the diameter D of the semispherical lenses 3 and 4 is larger than the thickness dimension d of the housing section 2. It has been found that D/d should be within the range of about 1.5 to about 3.0. In this context the term "about" is determined by the range requirements to be met by the transceiver in actual use. Thus, as range of 1.2 to 6.0 may be practical with 1.2 for a shorter range and 6.0 for a longer range.

In order to accommodate the above requirement of larger diameters for the lenses 3, 4, these lenses are integrally formed according to the invention along a side wall of the housing section 2 in such a way that a spacing A is provided between the insertion plane 15 and the optical axes 12 and 13. This spacing A is so selected that it is sufficient to permit the lenses 3 and 4 to project from the housing section 2 downwardly beyond the mounting plane 11 defined by the terminals 9 and coinciding with a surface of a circuit board 10 so that the upwardly facing portions of the lenses 4A and 4B do not project upwardly above the upwardly facing surface plane 2A of the housing section 2. Preferably, the surface plane 2A of the housing section 2 forms a tangent plane to the lens spheres 3 and 4. This arrangement has the advantage of achieving the required high reception and transmission power with the respective sufficiently large range for the received and emitted optical data signals by, for example, infrared carrier rays without making the surface of the detector chip 8 disproportionately large and without operating the emitter chip 7 with a disproportionately high current. Further, by presenting a plane surface 2A to an insertion automat without interference by the lens spheres 3 and 4 the insertion automat will have a sufficient area for handling the structural component when producing transceiver 1.

The arrangement of the flat housing section 2 and of the spherical lens sections 3 and 4 as described above and shown in FIG. 1A has the advantage that the transceiver 1 can be mounted along an edge of a circuit board 10 so that the lens sections 3 and 4 project downwardly along the edge as best seen in FIGS. 1B and 1C, thereby using as little space as possible on the surface of the circuit board 10. This feature also permits mounting the transceiver 1 as shown in FIG. 4B so that the lens sections 3, 4 face into and partly reach into a hole in the circuit board 10. Such mounting is optimal because not only does it reduce the space or surface area required on the circuit board, it also permits a more efficient utilization of the remaining circuit board surface for an optimal circuit layout. The arrangement of the circuit housing section and lens sections is further advantageous for installation in a housing already provided with an opening for the entrance and exit of the transmission radiation.

Another advantage of the invention resides in the fact that the conductor strips under the integrated circuit 6 on the printed circuit board 10 provides a good screening of the integrated circuit 6 against interference radiation, especially when a plurality of grid shaped conductor strips are arranged on the circuit board 10 and when these conductor strips are connected to a reference or ground potential.

FIGS. 1B and 1C show the transceiver 1 soldered with its terminals 9 on the contact surfaces of the circuit board 10, whereby the directional optical axes 12 and 13 of the lenses 3 and 4 extend parallel to the longitudinal central axis of the flat housing section 2. According to the invention the diameter D of the lenses 3 and 4 is larger than the thickness d of the flat housing section 2, thereby providing the above mentioned desirable higher transmitting and receiving powers and correspondingly increased range. The described arrangement of the lenses 3, 4 and their downward extension over the edge of the board 10 below the mounting plane 11 permits a minimal thickness of the finished product such as portable remote controls for a convenient handling of the remote control.

FIG. 1C illustrates in its sectional view the construction of the transceiver 1. The electrically conducting strip or grid strip 5 provides an insertion plane 15 to which the integrated circuit 6 is secured, e.g. by bonding o r gluing. The strip 5 is bent and the respective bent portion 14 provides a second insertion or mounting plane 15' carrying the emitter chip 7 and the detector chip 8 which are also glued or bonded to the conductor strip S. This bent-over portion 14 of the conductor strip 5 permits that the optical axes 12 and 13 of the lenses 3 and 4 extend in parallel to the longitudinal central axis of the housing section 2 for a side view orientation. The bending or angling of the bent portion 14 is at a right angle to achieve this orientation of the optical axes 12 and 13 when the mounting or insertion planes 15 and 15' extend normal to one another.

Figure 2:
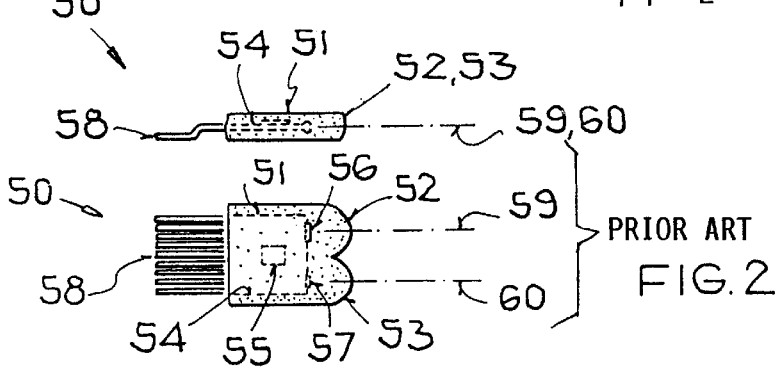
FIG. 2 is d side view and a top plan view of a conventional optical transceiver.

FIG. 2 shows a conventional structural component 50 including a housing 51 having a parallelepiped shape with two lenses 52 and 53 integrally molded with the housing. The lenses have optical axes 59 and 60 respectively. A conductor strip or grid strip 54 is arranged inside the component 50. The strip 54 carries an integrated circuit 55, an emitter chip 56 and a detector chip 57. Connector terminals 58 are provided for the electrical and mechanical connection with contact surfaces of a circuit board not shown. The terminals 58 have extensions that extend in parallel to the optical axes 59 and 60 and in parallel to the longitudinal axis of the housing 51. This type of construction limits the dimensions of the lenses 52 and 53 to a small aperture, whereby the transmission range of the optical data signal for transmitting and receiving is noticeably limited. The invention avoids this problem by positioning the large diameter lenses 3 and 4t along the edge E.

Figure 3:
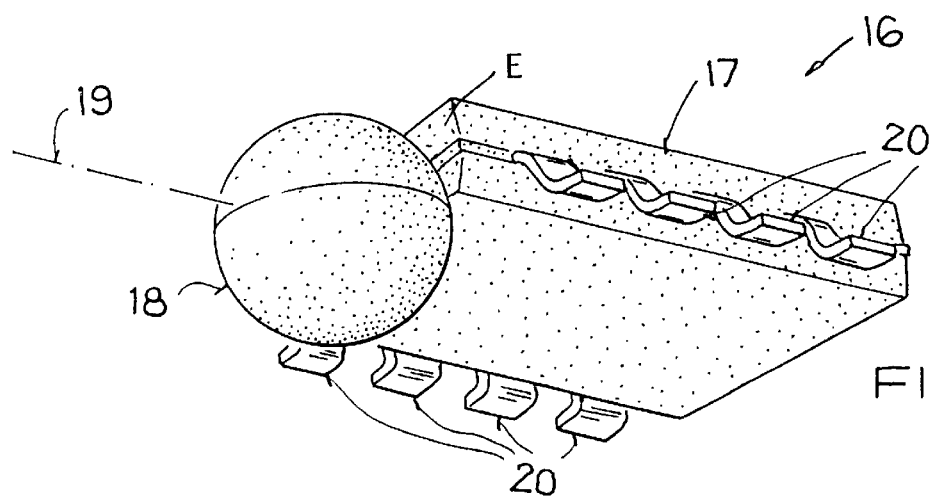
FIG. 3 is a perspective view of a second embodiment of a transceiver according to the invention with a single lens housing section positioned next to a side edge of the first housing section without protruding above a top surface of the first housing section but projecting downwardly below the first housing section in a side view position.

FIG. 3 shows a further embodiment of the invention also having a side view capability as indicated by the optical axis 19 of the lens 18 that is formed as an integral part of the flat housing section 17 having a flat parallelepiped shape which encloses the transceiver 16. The housing section 17 is made of an encapsulating or potting material for enclosing the integrated circuit components and chips as described above. The housing portion that forms the lens 18 is a thermoplastic or thermosetting material that is transparent for the radiation used, e.g. infrared radiation. The connector terminals 20 extend laterally from the housing section 17, as in FIG. 1A and form the mounting plane 11.

In FIG. 1 the emitter chip 7 and the receiver chip 8 are arranged next to each other. Contrary thereto in FIG. 3, the two chips 7 and 8 are arranged one on top of the other, whereby the detector chip has a larger surface area than the emitter chip to assure that transmission and reception do not interfere with one another. This feature is described in more detail in the above cross-referenced U.S. Ser. No. 09/104, 766, filed on Jun. 25, 1998. The arrangement has the advantage that only one lens 18 is required for the bundling or focussing of the transmitted and received optical data signals. This feature in turn reduces the volume of material required for the molding of the housing sections especially the lens forming sections. The number of manufacturing steps and the overall volume of the transceiver 16 are also reduced. The structure shown in FIG. 3 also provides a relatively large aperture of the lens 18 having a diameter D larger than the thickness d of the housing section 17. As a result, the transceiver 16 also satisfies the IRDA standards of a required transmission and reception range for the optical data signals.

Figure 4A:
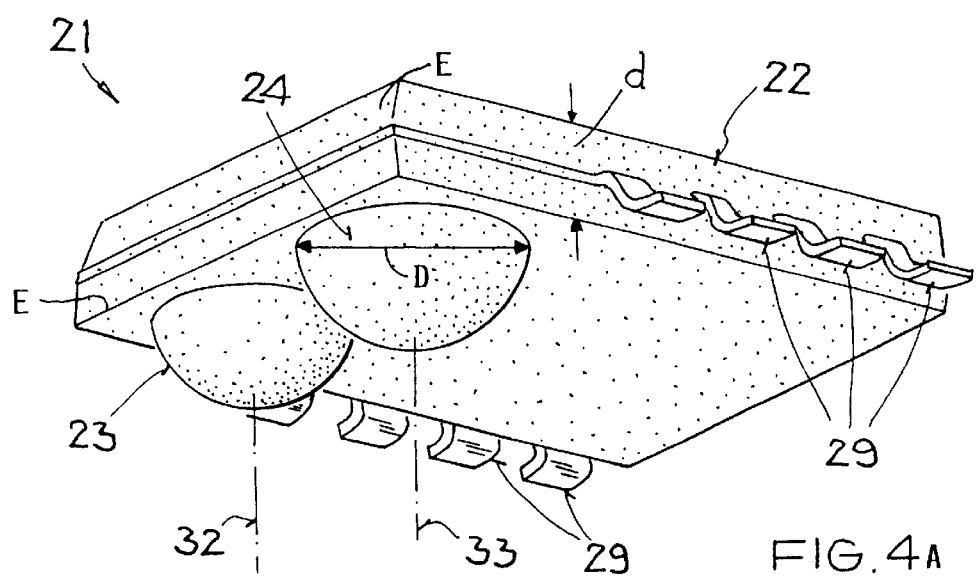
FIG. 4A is a perspective view of a third embodiment illustrating a so-called down view embodiment with two lens housing sections positioned alongside an edge of the first housing section.
Figure 4B:
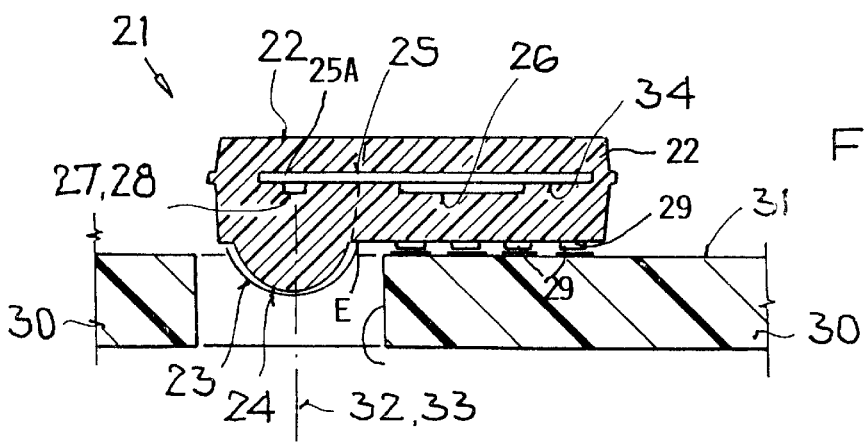
FIG. 4B is a sectional view of the arrangement of FIG. 4A to show how the lens housing section reaches into a hole in a circuit board with all circuit components and emitter and detector chips mounted to the same side of a conductor strip.

FIGS. 4A and 4B show a modified embodiment of the invention wherein the transceiver 21 has its lenses 23 and 24 arranged alongside one edge E of the housing 22. The lenses 23, 24 are oriented with their optical axes 32 and 33 for a down view. The housing 22 again has the required flat parallelepiped shape for protecting them integrated circuits 26 connected to terminals 29. The lenses 23 and 24 have respective optical axes 32 and 33 positioned in optical alignment with the emitter chip 27 and a detector chip 28, respectively. Relatively large apertures of the lenses 23 and 24 are achieved since their diameters D are larger than the thickness d of the housing 22. Accordingly, the transceiver 21 also meets the IRDA standards with regard to the reception and transmission range for the optical data signals.

The down view orientation shown in FIGS. 4A and 4B permits the downward transmission of optical data signals and the reception of upward directed receiver signals. The mounting conductor strip 25 with an insertion or attachment plane 34 serves as carrier for the integrated circuit 26, for the emitter chip 27 and the detector chip 28 which are so arranged that the mounting conductor strip 25 extends in parallel to the mounting surface 31 of a circuit board 30, whereby the optical axes 32 and 33 extend perpendicularly to the mounting plane 31 in which the connector terminals 29 are positioned.

The transceiver 21 can be arranged along an edge of a circuit board 30 or next to an aperture 30A in a circuit board so that the enlarged lenses 23, 24 can dip into the aperture 30A. The mounting strip or grid 25 has an extension 25A that reaches to a position above the lenses 23, 24 so that the lenses can dip into the aperture 30A or over an edge. In both instances the use of surface area on the circuit board itself is minimized due to the arrangement of the lenses along the edge E of the transceiver 21. The arrangement shown in FIGS. 4A and 4B with two lenses could be modified by using but one lens as in FIG. 3, however positioned inside and next to the edge E of the housing section 22 and not outside and next to the edge E as in FIG. 3. In such an embodiment, one of the chips 27 or 28 would be substantially larger in surface area than the other chip so that these two chips can be arranged in a row without interference between transmission and reception. Similarly, the mounting strip 25 would be modified accordingly.

Although the invention has been described with reference to specific example embodiments, it will be appreciated that it is intended to cover all modifications and equivalents within the scope of the appended claims. It should also be understood that the present disclosure includes all possible combinations of any individual features recited in any of the appended claims.

What is claimed is:

1. A radiation transceiver (1) comprising a housing including a first housing section (2 . . . ) having a flat first surface (2A) and a flat second surface (2B) parallel to said first surface, said flat first and second surfaces being spaced from each other by a given housing thickness (d), at least one integrated circuit (6) for signal processing enclosed in said first housing section, an emitter chip (7) and a detector chip (8) enclosed in said housing, electrical terminals (9) connected to said integrated circuit (6) and to said emitter and detector chips (7, 8), said electrical terminals (9) extending out of said housing to define a mounting plane (11), at least one second housing section (3, 4) forming at least one lens for focussing radiation energy, said second housing section (3, 4) being molded along an edge (E) of and as an integral part of said first housing section (2), said lens forming second housing section (3, 4) having at least one hemispherical configuration and a lens diameter (D) that is larger than said given housing thickness (d) thus D>d so that said second housing section positioned along said edge (E) projects below said mounting plane (11) defined by said electrical terminals (9) without projecting outside said flat first surface (2A) of said housing, said at least one lens having a directional axis (12, 19, 32) for a side view mode or a down view mode, whereby said larger lens diameter provides a respectively improved transmission and reception range.

2. The transceiver of claim 1, wherein said integrated circuit (6) is embedded in said first housing section.

3. The transceiver of claim 1, further comprising an electrically conducting strip (5) in said first housing section, said strip (5) having a first strip surface (15A) facing said flat first housing surface (2A) and a second strip surface (15) facing said second housing surface (2B), said integrated circuit (6) being secured to said second strip surface (15) for protection against electromagnetic interference radiation.

4. The transceiver of claim 1, wherein said electrical terminals (9, 20) are arranged in said first housing section (2) in a symmetric distribution relative to a longitudinal axis of said first housing section (2), said electrical terminals (9) having extensions extending out of said first housing section and defining said mounting plane (11).

5. The transceiver of claim 1, wherein said emitter chip (7) is capable of emitting electromagnetic wave energy, and wherein said detector chip (8) is capable of receiving said electromagnetic wave energy.

6. The transceiver of claim 5, wherein said electromagnetic wave energy is within the range of infrared, to and including ultraviolet.

7. The transceiver of claim 1, wherein said lens diameter (D) is about 1.2 to about 6.0 times larger than said housing thickness (d).

8. The transceiver of claim 3, wherein said electrically conducting strip (5) has a bent portion (14) having a third strip surface (15') facing said second housing section (3), and wherein said emitter and detector chips (7, 8) are mounted on said third strip surface (15') for cooperation with said directional axis of said at least one lens in said side view mode, and wherein said integrated circuit (6) is applied on one side (15) of said strip (5) and said emitter and detector chips (7, 8) are mounted on said third strip surface (15') of said bent portion (14) of said strip (5).

9. The transceiver of claim 3, wherein said electrically conducting strip (25) has a flat configuration including an end portion (25A) reaching into said second housing section (3), wherein said emitter and detector chips (7, 8) are mounted on a side (34) of said end portion (25A) of said strip (25) for cooperation with said directional axis in said down view mode, and wherein said integrated circuit (6) is mounted on the same side (34) of said strip (5).

10. The transceiver of claim 1, wherein said second housing section forms at least two lens portions side-by-side and along said edge (E) of said first housing section.

11. The transceiver of claim 1, wherein said at least one lens is positioned outside of but connected to said first housing section (2) alongside said edge (E).

12. The transceiver of claim 1, wherein said at least one lens is positioned on said second surface (2B) of said first housing section (2) directly alongside said edge (E).

* * * * *

UNITED STATES PATENT AND TRADEMARK OFFICE
CERTIFICATE OF CORRECTION

PATENT NO. : 6,417,946 B1
DATED : July 9, 2002
INVENTOR(S) : Krieger

It is certified that error appears in the above-identified patent and that said Letters Patent is hereby corrected as shown below:

Title page,
Item [56], References Cited, U.S. PATENT DOCUMENTS, insert:
-- 5,506,445 4/1996 Rosenberg
     5,668,383 9/1997 Krieger --.

Item [56], References Cited, insert:
-- FOREIGN PATENT DOCUMENTS
EP 0712161 5/1996
DE 19600678 7/1997 --.

Column 3,
Line 26, after "is", replace "d" by -- a --.

Column 5,
Line 59, after "bonding", replace "o r" by -- or --;
Line 63, after "strip", replace "S." by -- 5. --.

Column 6,
Line 19, after "and", replace "4t" by -- 4 --.

Signed and Sealed this

Twenty-second Day of October, 2002

Attest:

JAMES E. ROGAN
Attesting Officer    Director of the United States Patent and Trademark Office